(12) United States Patent
Fuergut et al.

(10) Patent No.: US 7,915,089 B2
(45) Date of Patent: Mar. 29, 2011

(54) ENCAPSULATION METHOD

(75) Inventors: Edward Fuergut, Dasing (DE); Irmgard Escher-Poeppel, Regensburg (DE); Markus Brunnbauer, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 276 days.

(21) Appl. No.: 11/733,289

(22) Filed: Apr. 10, 2007

(65) Prior Publication Data

US 2008/0254575 A1  Oct. 16, 2008

(51) Int. Cl.
*H01L 21/00* (2006.01)

(52) U.S. Cl. .......... 438/127; 264/511; 438/124

(58) Field of Classification Search .......... 264/511; 438/127, 124
See application file for complete search history.

(56) References Cited

U.S. PATENT DOCUMENTS

| | | | |
|---|---|---|---|
| 4,488,862 A | 12/1984 | Epel et al. | |
| 4,573,900 A | 3/1986 | Smith | |
| 6,770,236 B2 | 8/2004 | Miyajima | |
| 6,791,198 B2 * | 9/2004 | Street et al. | 257/786 |
| 6,833,628 B2 | 12/2004 | Brandenburg et al. | |
| 7,147,447 B1 * | 12/2006 | Takahashi | 425/89 |
| 7,618,573 B2 * | 11/2009 | Takase et al. | 264/272.15 |
| 2004/0048416 A1 | 3/2004 | Takase | |

FOREIGN PATENT DOCUMENTS

DE   102005057400   12/2006

OTHER PUBLICATIONS

Brunnbauer et al., Embedded Wafer Level Ball Grid Array (eWLB), Electronics Packaging Technology Conference, 2006, pp. 5.

* cited by examiner

*Primary Examiner* — Thanh V Pham
*Assistant Examiner* — Caleb Henry
(74) *Attorney, Agent, or Firm* — Dicke, Billig & Czaja, P.L.L.C.

(57) ABSTRACT

A method and apparatus for encapsulating items such as electronic devices. A mold material is dispensed onto the electronic device and the device is situated between first and second molds. One mold is moved towards the other so as to vary the size of a cavity defined by the first and second molds. A vacuum is applied to the cavity and the vacuum is varied in response to the size of the cavity. The vacuum can be varied in response to a predetermined vacuum profile. For example, in certain embodiments the vacuum is varied in response to the position of the first mold relative to the second mold, wherein the vacuum is increased as the cavity height is reduced.

22 Claims, 5 Drawing Sheets

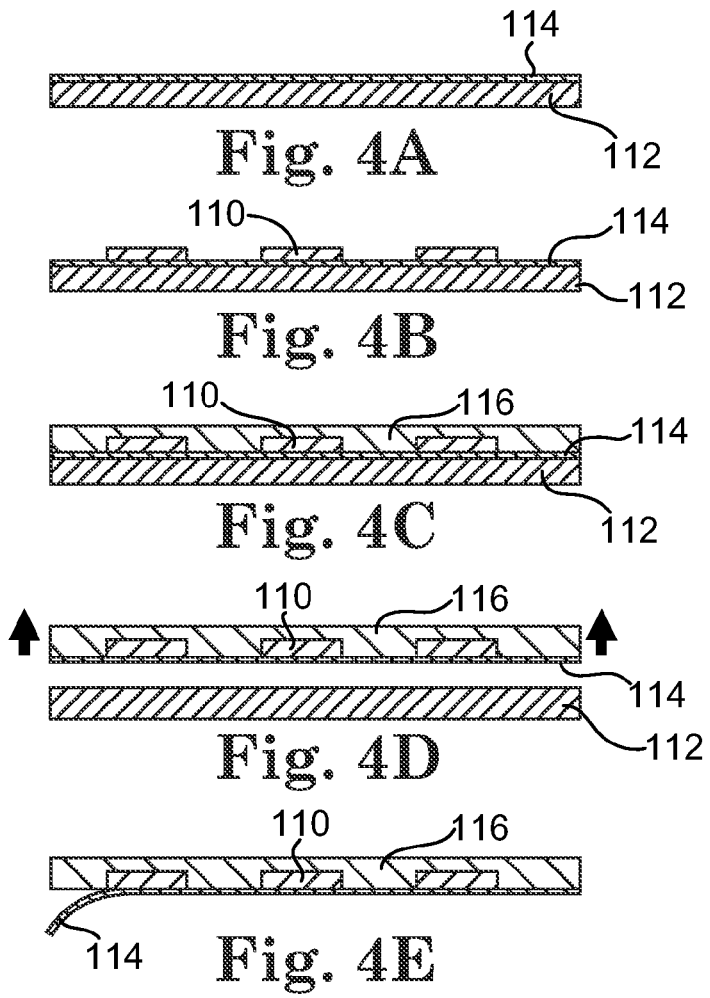
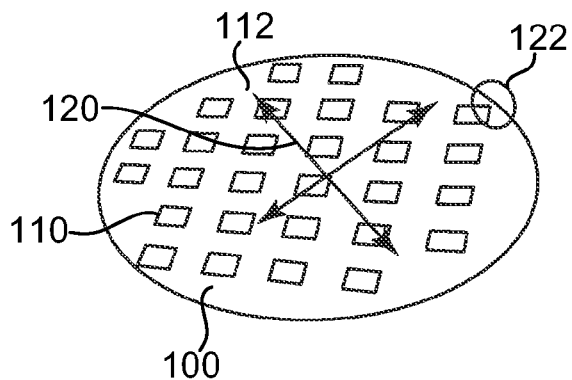
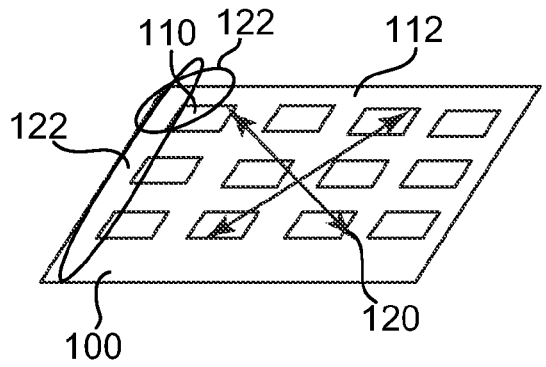

ENCAPSULATION METHOD

BACKGROUND

Electronic devices, such as integrated circuit (IC) packages, typically include a plurality of semiconductor devices arranged on a carrier and encapsulated. Prior to encapsulation, bond wires are attached to bond pads on the semiconductor devices and to lead fingers on the carrier. The device is then encapsulated to protect the device and form a housing from which the leads extend.

Transfer molding is one known technique for encapsulation of electronic devices. This includes transferring a thermally liquefied molding material under pressure into a pre-formed cavity. However, the mold material used in transfer molding processes typically is pre-cured to obtain a solid material, then ground and palletized. This can result in flowability problems. Moreover, transferring the molding material under pressure can result in damage to components of the device, especially the delicate bond wires.

Compression molding is another encapsulation method, wherein a liquid molding material is dispensed on the device to be encapsulated and the device is compressed between molds to spread the mold material over the device. With some configurations of semiconductor devices on the carrier, it can be difficult to get the molding material to flow to all areas of the device, resulting in undesirable voids in the encapsulated product.

SUMMARY

In accordance with aspects of the present disclosure, a process for encapsulating items such as electronic devices includes dispensing a mold material onto the electronic device and situating the electronic device between first and second molds. One mold is moved towards the other so as to vary the size of a cavity defined by the first and second molds. A vacuum is applied to the cavity and the vacuum is varied in response to the size of the cavity. The vacuum can be varied in response to a predetermined vacuum profile. For example, in certain embodiments the vacuum is varied in response to the position of the first mold relative to the second mold, wherein the vacuum is increased as the cavity height is reduced.

In accordance with further aspects of the present disclosure, a pump is in communication with the cavity to create the vacuum in the cavity and a controller is connected to the pump and to an actuator that moves the molds. The controller is programmed to vary the vacuum applied to the cavity in response to the size of the cavity, such as by varying the pump operation or operating a valve based on movement of the mold by the actuator.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIGS. 4A-4E are block diagrams conceptually illustrating a process for producing an encapsulated electronic device.

FIG. 5 is a top perspective view of a circular embodiment of an electronic device having semiconductor devices arranged on a carrier.

FIG. 6 is a top perspective view of a rectangular embodiment of an electronic device having semiconductor devices arranged on a carrier.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
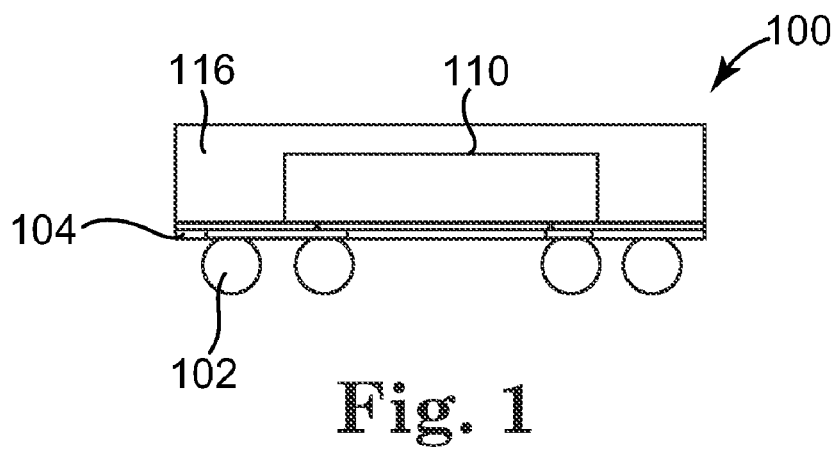
FIG. 1 is a side view conceptually illustrating an encapsulated electronic device.

FIG. 1 is a side view of an exemplary electronic device 100, which includes one or more semiconductor devices (chips) 110 encapsulated in a mold compound 116. In one exemplary embodiment, the device 100 is a wafer level ball grid array (WLB), in which the backside of each semiconductor device 110 and its edges are covered with the mold compound 116 and an array of interconnect solder balls 102 are attached to the active side of the semiconductor devices 110. The connection from the semiconductor devices 110 to the solder contact of the device 100 is applied by a redistribution layer (RDL) 104.

Figure 2:
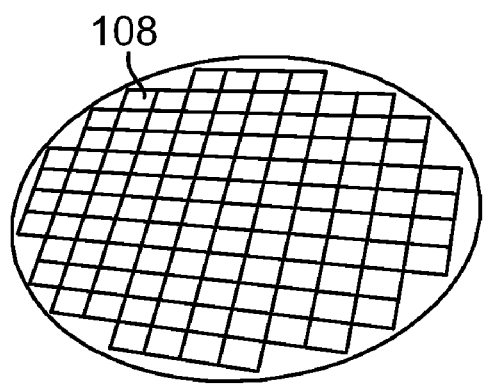
FIG. 2 is a block diagram illustrating a singulated semiconductor wafer.
Figure 3:
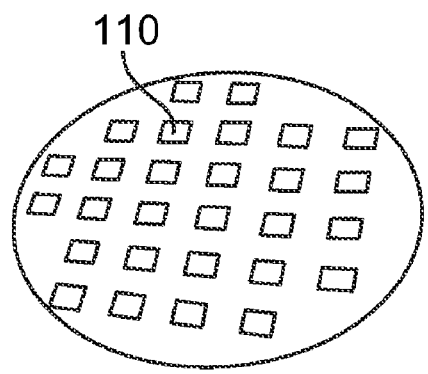
FIG. 3 is a block diagram illustrating semiconductor devices in a spaced-apart configuration.

FIGS. 2 and 3 illustrate a process sometimes referred to as "reconfiguration," in which a plurality of the semiconductor devices 110 are spaced apart and the gaps between the semiconductor devices 110 subsequently filled with the mold material 116. In FIG. 2, a singulated wafer 108 comprising the semiconductor devices 110 is shown, and in FIG. 3 the individual semiconductor devices 110 are shown after having been picked from the singulated wafer and placed onto a carrier plate 112 in a spaced-apart configuration with larger spacing between semiconductor devices 110. This provides additional space around the active area of the semiconductor devices 110 for interconnect elements, and the molding material 116 provides a relatively inexpensive placeholder for bearing the additional interconnect elements.

FIGS. 4A-4E illustrate portions of an exemplary process for producing the electronic device 100. In FIG. 4A, a double-sided adhesive tape 114 is applied to a carrier plate 112, for example, a metal carrier plate. Typical adhesive tapes have a lower stiffness with increased temperature. Thus, the carrier plate 112 provides additional support to the assembly during molding. The tape 114 has a releasable adhesive on one side that allows the removal of the tape 114 after molding. FIG. 4B illustrates the semiconductor devices 110 being placed onto the mounted tape 114 the active area facing down, and in FIG. 4C the mounted semiconductor devices 110 are encapsulated by the mold material 116. In FIGS. 4D and 4E, respectively, the molded device 100 is released from the carrier plate 112 and the tape 114 is removed from the molded device 100 by heating the tape 114.

FIGS. 5 and 6 illustrate top-perspective views of different arrangements of the device 100, with FIG. 5 illustrating the semiconductor devices 110 arranged to form a generally circular device, and FIG. 6 illustrating the semiconductor devices 110 arranged to form a generally square or rectangular device. The encapsulation 116 is not shown in FIGS. 5 and 6 for sake of simplicity. The circular electronic device 100 shown in FIG. 5 may have a standard diameter for silicon wafers, for example about 300 mm, for processing the device 100 later in standard silicon wafer processing machines.

By encapsulating the semiconductor devices 110 in the mold material 116 and giving it a shape of a standard silicon wafer as shown in FIGS. 5 and 6, for example, the manufacturing of the redistribution layers 104 (shown in FIG. 1) can be carried in out in standard semiconductor manufacturing apparatuses. For example, the metallization layers of the redistribution layers may be formed in standard plasma deposition or sputter apparatuses. Deposition of the insulation layers between the metallization layers may be carried in a standard chemical-vapor-deposition (CVD) apparatus, and structuring of the metallization or insulation layers may be carried out in standard equipment used for photolithographic structuring. Using standard semiconductor processing equipment for applying redistribution layers to wafer shaped electronic devices 100 simplifies the manufacturing of packaged electronic devices 100, and facilitates complex redistribution layer layout due to superior thin-film deposition and structuring capabilities of semiconductor processing equipment.

When encapsulating the semiconductor devices 110, mold material is typically deposited at the center of the semiconductor devices 110 and the carrier 112 with the semiconductor devices 110 attached thereto are compressed between top and bottom molds to distribute the mold material over the semiconductor devices as indicated by arrows 120 in FIGS. 5 and 6. However, the illustrated arrangement of the semiconductor devices 110 on the carrier 112 results in some locations 122 on the carrier 112 where the mold material tends not to adequately flow.

To improve flow of the mold materials to these areas and to improve the encapsulation process in general, an encapsulation method and device include applying a vacuum to a cavity defined by molds of an encapsulation machine. The vacuum is applied to avoid voids in finished encapsulation. Applying too much vacuum to the cavity can have a negative effect. Vacuum values vary depending on application and materials used. Moreover, the proper level of vacuum does not necessarily remain constant throughout the encapsulation process. For example, the required vacuum level can vary from about 100 Pa (0.0145 psi) to atmosphere.

Figure 7:
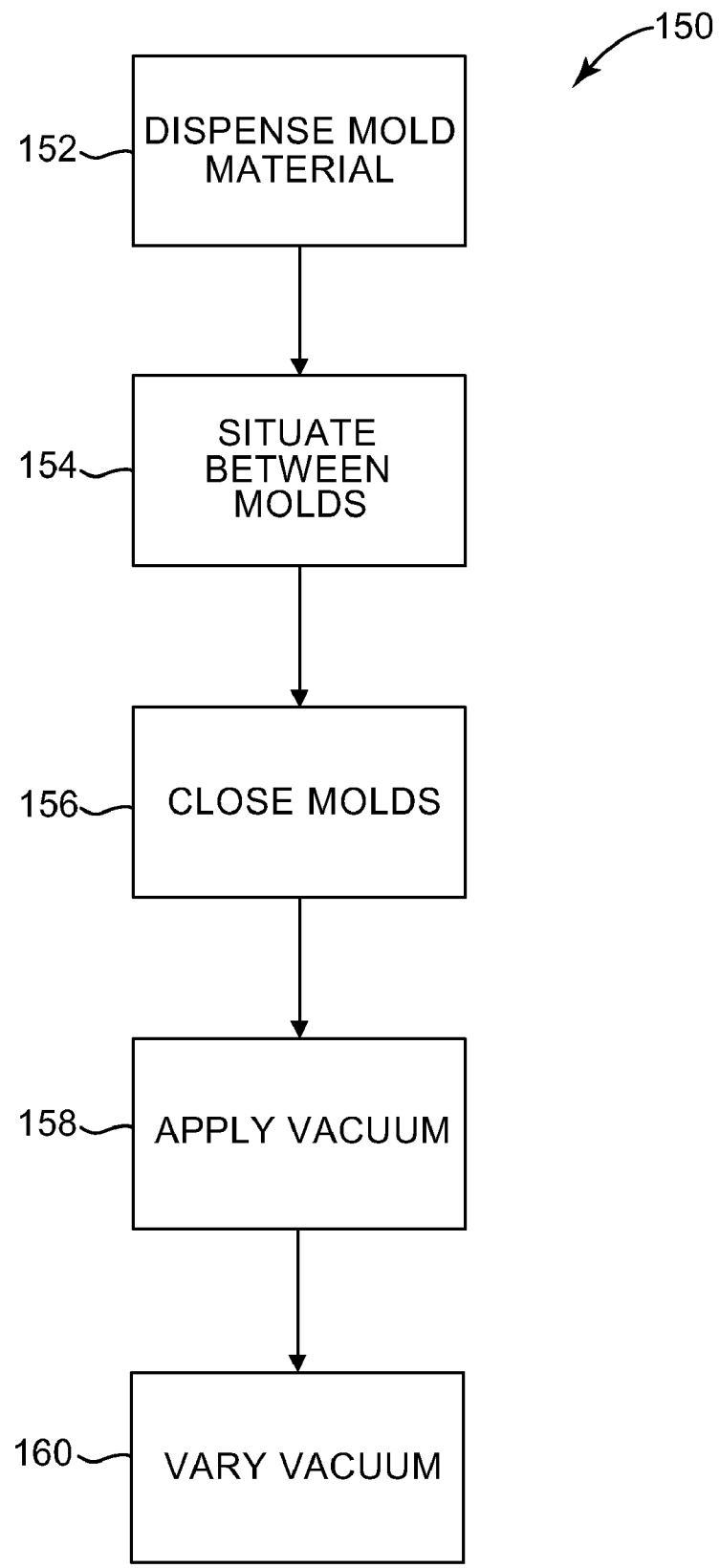
FIG. 7 is a flow diagram illustrating an exemplary molding method.

FIG. 7 is a flow diagram illustrating an exemplary encapsulating method 150 in accordance with embodiments of the present invention, resulting in an encapsulated electronic device such as the device 100. In block 152, mold material is dispensed onto the electronic device to be encapsulated. Typically, the electronic device would include the semiconductor devices 110 attached to the carrier 112 with tape 114, as described in FIG. 4. The electronic device is situated between first and second molds in block 154, and one or both of the molds are moved towards each other to vary the size of a cavity defined between them in block 156. In block 158 a vacuum is applied to the cavity to distribute the mold material over the electronic device, and in bock 160 the vacuum is varied in response to the size of the cavity.

Figure 8:
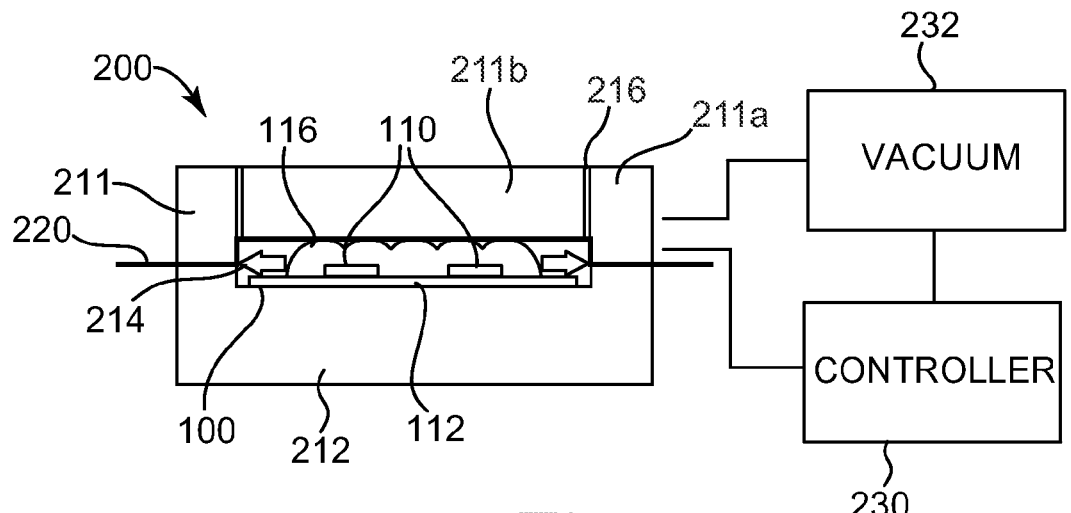
FIG. 8 is a block diagram conceptually illustrating an exemplary encapsulating apparatus.

FIG. 8 conceptually illustrates further aspects of an exemplary process for encapsulating electronic devices in accordance with aspects of the present disclosure. The machine 200 includes first and second, or top and bottom molds 211, 212 that define a cavity 214 between the molds 211,212. The top mold 211 has an outer form part 211a that seals the periphery of the cavity 214 and an inner form part 211b that can be moved up and down to change the cavity height. A seal 216 is positioned between the outer and inner form parts 211a, 211b that allows the inner form part 211b to move relative to the outer form part 211a in a sealed manner.

An electronic device, such as the semiconductor devices 110 attached to the carrier 112 of device 100, is placed in the cavity 214, typically on the bottom mold 212, to be encapsulated. The molds 211, 212, and thus the cavity 214, may be specifically adapted to receive a particular device, such as the round or square device 100 illustrated in FIGS. 2 and 3, respectively.

Molding material 116 is dispensed onto the semiconductor devices 110 attached to the carrier 112, and the outer form part 211a is sealed against the bottom mold 212 by any of a number of suitable means, such as clamping or screwing, for example. The inner form part 211b is then moved towards the bottom mold 212, compressing the molding material 116 and dispersing it over the surface of the semiconductor devices 110. In some embodiments, a release film 220 lines the inside surface of the top mold 211 to facilitate removal of the encapsulated device 100 from the machine 200.

Changing the position of the inner form part 211b relative to the outer form part 211a and the bottom mold 212 varies the volume of the cavity 214. A controller 230 is connected to an actuator 234 (shown in FIG. 9) to control the movement of the molds 211,212. In the illustrated embodiment, the top mold 211 is movable relative to the fixed bottom mold 212. The molding material 116 may be heated before and/or during movement of the mold 211, and once the molds 211,212 are in their completely closed position, the molds may be clamped together. For example, the mold material may be a suitable epoxy with an inorganic filler, and the mold material is dispensed and compressed at a temperature of about 100-200° C., depending on the specific mold material used.

A pump 232 is connected to one or both of the molds 211,212 at one or more locations so as to selectively evacuate the cavity 214. Among other things, creating a vacuum in the cavity 214 improves the distribution of the molding material 114 over the device 100 and reduces the forming of voids within the mold material.

Figure 9:
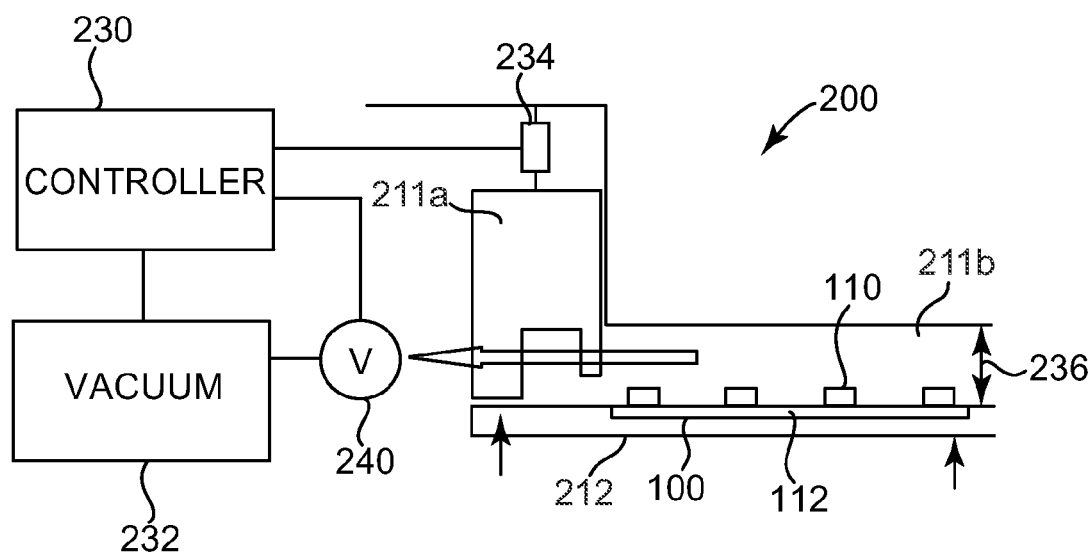
FIG. 9 is a block diagram illustrating further aspects of the apparatus shown in FIG. 8.
Figure 10:
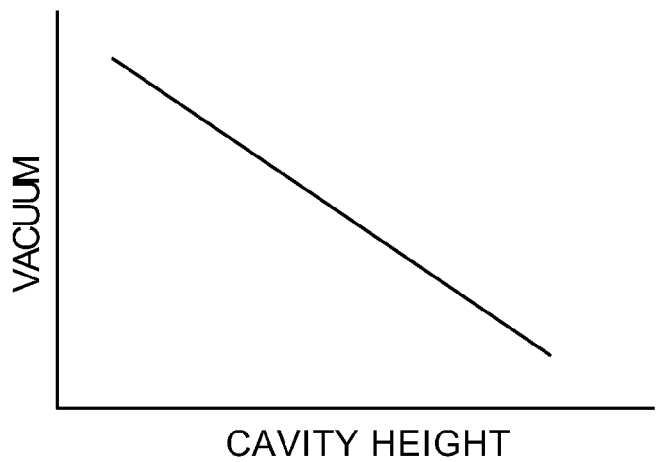
FIG. 10 illustrates an exemplary vacuum profile.

FIG. 9 conceptually illustrates further aspects of the encapsulating machine 200. The controller 230 is connected to both the vacuum pump 232 and an actuator 234 that controls movement of the inner form part 211b of the top mold 211 to vary the cavity height 236 as desired to compress the mold material appropriately. Thus, the vacuum 232 can be varied in response to the size of the cavity 214. In exemplary embodiments, the vacuum is varied in response to a predefined vacuum profile. FIG. 10 illustrates a simple profile in which the vacuum is greatest when the cavity height 236 (cavity volume) is smallest. The vacuum pressure can be controlled in response to one or more of several variables, each of which typically is directly or indirectly related to the volume of the cavity 214. For instance, to vary the vacuum, the speed of the vacuum pump 232 can be controlled in response to the cavity volume itself, the cavity height 236 (height of the top mold 211 over the bottom mold 212), the amount of time the mold 211 has been moving, etc.

Figure 11:
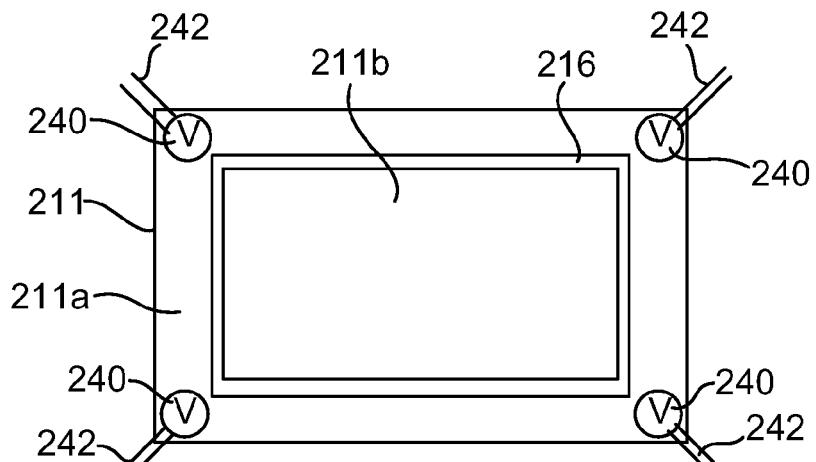
FIG. 11 is a top view schematically illustrating an exemplary rectangular mold.
Figure 12:
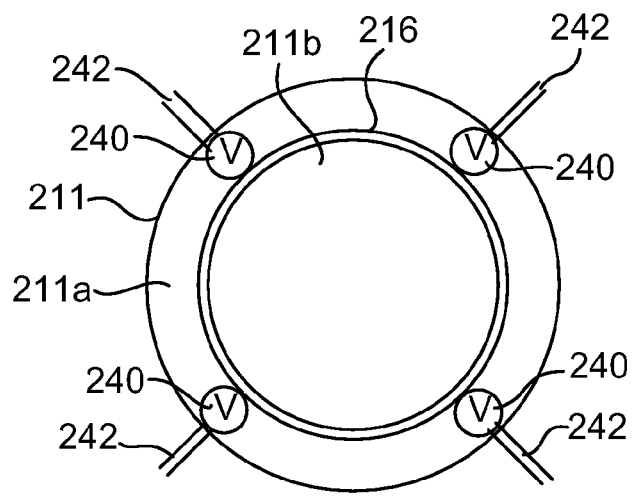
FIG. 12 is a top view schematically illustrating an exemplary rectangular mold.

In some embodiments, one or more valves 240 are in communication with the cavity 214. In the illustrated embodiment, the valve 240 is connected between the vacuum source 232 and the cavity 214 to selectively vent the cavity 214. The provision of the valve 240 to adjust the vacuum in the cavity 214 is especially useful when encapsulating rectangular devices. For example, the one or more valves 240 can be located at the corners of a rectangular vacuum cavity. FIG. 11 conceptually illustrates a top mold 211 forming such a rectangular cavity 214, with a valve 240 positioned at each corner. The valves 240 are in fluid communication with the pump 232 (see FIG. 9) via corresponding conduits 242 to selectively create the vacuum in the cavity 214. When dispensing the mold material in the center of the rectangular device, the mold material reaches the corner regions of the cavity 214 at the end of the flow process. This way, a large fraction of the cavity 214 can be filled with mold material before the valve 240 is closed to prevent mold material from entering the valve 240. FIG. 12 conceptually illustrates a generally circular top mold 211 that could be used for encapsulating a reconfigured wafer of standard wafer size. The exemplary circular top mold 211 includes four equally-spaced valves 240 at the mold's periphery.

The controller 230 is connected to the valve 240 to operate the valve 240 in response to the height/size of the cavity 214. Operation of the valve 240 further can be used to vary the vacuum in the cavity 214 when a non-variable pump is used. Once the molding material 116 has been properly dispersed and compressed, it can be cured. The top mold 211 is then raised to release the encapsulated device 100 from the cavity 214.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for encapsulating an electronic device, comprising:
dispensing a mold material onto the electronic device;
situating the electronic device between first and second molds;
moving the first mold towards the second mold so as to vary the size of a cavity defined by the first and second molds;
applying a vacuum pressure to the cavity; and
continuing to move the first mold while varying the vacuum pressure in response to the size of the cavity as defined by the relative positions of the first and second molds, including varying the vacuum pressure in response to the position of the first mold relative to the second mold, such that the vacuum pressure is continuously increased as the size of the cavity is decreased.

2. The method of claim 1, wherein after applying vacuum pressure to the cavity, the vacuum is pressure varied in response to a predetermined vacuum profile, such that the vacuum pressure is the greatest when the size of the cavity is smallest, and the vacuum pressure is less when the cavity is larger.

3. The method of claim 1, wherein varying the vacuum pressure in response to the size of the cavity includes varying the vacuum pressure in response to a predetermined time period.

4. The method of claim 3, wherein the predetermined time period includes an amount of time the first mold has been moving towards the second mold.

5. The method of claim 1, further comprising applying a release film to at least one of the first or second molds.

6. The method of claim 1, further comprising heating the mold material.

7. The method of claim 6, wherein the mold material is heated before moving the first mold towards the second mold.

8. The method of claim 6, wherein heating the mold material includes heating at least one of the first or second molds.

9. The method of claim 1, wherein moving the first mold towards the second mold compresses the mold material, and wherein the vacuum pressure is applied after the mold material is compressed to further distribute the mold material over the electronic device.

10. The method of claim 1, further comprising curing the mold material.

11. The method of claim 1, further clamping the first mold to the second mold.

12. The method of claim 1, further comprising venting the cavity in response to the cavity size.

13. The method of claim 12, wherein venting the cavity includes adjusting a valve in response to the cavity size.

14. The method of claim 1, further comprising moving the first mold away from the second mold to release the electronic device.

15. The method of claim 1, further comprising sealing an outer form portion of the first mold against the second mold, and wherein moving the first mold towards the second mold comprises moving an inner form portion of the first mold towards the second mold.

16. The method of claim 1, wherein the electronic device includes a plurality of semiconductor devices, and wherein the method further comprises attaching the semiconductor devices to a carrier.

17. The method of claim 16, wherein the semiconductor devices are attached to the carrier using adhesive tape.

18. The method of claim 16, further comprising singulating a semiconductor wafer into the plurality of semiconductor devices, and situating the singulated semiconductor devices in a spaced-apart arrangement.

19. The method of claim 1, wherein the mold material is dispensed onto the electronic device prior to situating the electronic device between the first and second molds.

20. The method of claim 1, wherein the mold material is dispensed onto the electronic device prior to applying the vacuum pressure to the cavity.

21. The method of claim 1, wherein the mold material is dispensed onto the electronic device prior to moving the first mold towards the second mold.

22. The method of claim 1, further comprising compressing and distributing the mold material over the electronic device by moving the first mold towards the second mold.

* * * * *